United States Patent [19]
Matsuura et al.

[11] Patent Number: 6,027,376
[45] Date of Patent: Feb. 22, 2000

[54] CONNECTOR FOR INTEGRATED CIRCUIT CHIP

[75] Inventors: Naoya Matsuura, Yokohama; Tomonari Kaneko, Yamato, both of Japan

[73] Assignee: Molex Incorporated, Lisle, Ill.

[21] Appl. No.: 09/034,126

[22] Filed: Mar. 3, 1998

[30] Foreign Application Priority Data

Mar. 7, 1997 [JP] Japan ................................. 9-070458

[51] Int. Cl.[7] .................................................. H01R 25/00
[52] U.S. Cl. ........................ 439/638; 439/945; 439/907
[58] Field of Search .............................. 439/71, 525, 526, 439/638, 653, 945, 907

[56] References Cited

U.S. PATENT DOCUMENTS

| 3,470,522 | 9/1969 | Lawrence ................................. 339/14 |
| 3,853,388 | 12/1974 | Heimbrock ............................... 439/685 |
| 4,702,706 | 10/1987 | Sadigh-Behzadi ....................... 439/654 |
| 4,747,784 | 5/1988 | Cedrone ..................................... 439/71 |
| 4,767,357 | 8/1988 | Hasircoglv ............................... 439/499 |
| 4,907,976 | 3/1990 | Killcommons ........................... 439/525 |
| 5,017,151 | 5/1991 | Peterson .................................. 439/248 |
| 5,052,951 | 10/1991 | Johnson .................................. 439/723 |
| 5,286,222 | 2/1994 | Yagi et al. ............................... 439/607 |
| 5,295,843 | 3/1994 | Davis et al. ............................. 439/108 |

*Primary Examiner*—Neil Abrams
*Attorney, Agent, or Firm*—Charles S. Cohen

[57] ABSTRACT

A connector assembly for an integrated circuit includes two interengaging connector components. One of the components (1) has a chip receiving socket that receives the integrated circuit (41) while the other component (21) has a wire receiving socket that receives at least one array of wires (99). Each component further includes a plurality of conductive terminals (3,23) that engage the integrated circuit or the wires. The terminals of the other component have their contact portions (29) offset. Two of the terminals of the one component are interconnected so they have two contact blades (10) but only one IC engaging contact (8) whereby a single lead (42) of the IC may be electrically joined to a pair of the wires (99), the voided contact spring region being for alignment with a dummy lead of the IC. The terminals (3,23) are formed in a single die and simultaneously inserted into their respective housings in order to simplify the manufacturing process.

5 Claims, 12 Drawing Sheets

CONNECTOR FOR INTEGRATED CIRCUIT CHIP

BACKGROUND OF THE INVENTION

The present invention relates generally to a connector that connects a circuit to an integrated circuit and also to a method of making an electric connector having parallel, but differently shaped terminals.

Many electronic devices require integrated circuit chips. These circuit chips are commonly mounted to a printed circuit board. Space on a circuit board is at a premium and often the need arises to connect such an integrated circuit to a series of circuits on another electronic device. In order to conserve space on the device's printed circuit board, it is advantageous to connect the integrated circuit directly to a connector, which is then mated with an opposing connector to establish a connection between the integrated circuit and a series of circuits of another device.

Many integrated circuit chips have a plurality of conductive leads that are connected to different circuits of a device. Often, one of the leads of the chip is not terminated to any circuit. In order to accommodate this aspect, integrated circuit chip connectors need to have conductive terminals of different shapes and/or lengths. Also, it is desirable that the ground lead of the integrated circuit chip be connected first to a circuit before connecting the remaining chip leads in order to protect the chip.

In making such a connector that has a series of parallel terminals which include at least one different-shaped terminal, two groups of these terminals of their different shape are separately stamped out of thin conductive sheet metal. The differently-shaped terminals are fixed, one after another, in separate locations in an insulating connector housing. Therefore, individual actions are required for the stamping of terminals having different shapes and then separately fixing them in different locations in a connector housing. Thus, the number of dies and manufacturing steps with such connectors inevitably increases leading to a loss in manufacturing efficiency.

The present invention is directed to both a novel connector structure and a method for making such connectors.

SUMMARY OF THE INVENTION

Accordingly, it is a general object of the present invention to provide a connector for receiving an integrated circuit including a housing and terminals manufactured utilizing the least number of dies and punches.

Another object of the present invention is to provide a connector particularly suitable for connecting an IC chip to a plurality of wire circuits in which some of the connector terminals have different shapes and lengths to accommodate predetermined leads of the IC chip.

Still another object of the present invention is to provide a connector for an integrated circuit, the connector having a housing and a set of terminals disposed therein.

The connector component terminal arrangements are made using a "four-up" progressive die such that sets of four adjacent terminals are serially formed as the terminal metal strip passes through the die, thereby decreasing the manufacturing time and increasing the manufacturing efficiency.

These and other objects, features and advantages of the present invention will become apparent from the following detailed description, taken in conjunction with the accompany drawings, wherein like reference numerals refer to the parts.

BRIEF DESCRIPTION OF THE DRAWINGS

In the course of this detailed description, reference will be made to the accompanying drawings in which.

DESCRIPTION OF THE PREFERRED EMBODIMENT

The present invention relates to connectors that establish a connection between an integrated circuit of one device and a series of circuits of another device. A pair of such connectors is illustrated generally at 98 in FIG. 19. The connector pair 98 includes two interengaging connector components 1, 21 that mate together to form a connection between an integrated circuit in the form of an IC chip 41 and a plurality of circuit wires 99 mated to connector blocks 127. Such connectors 98 are commonly used in laser printers for computers.

Figure 1:
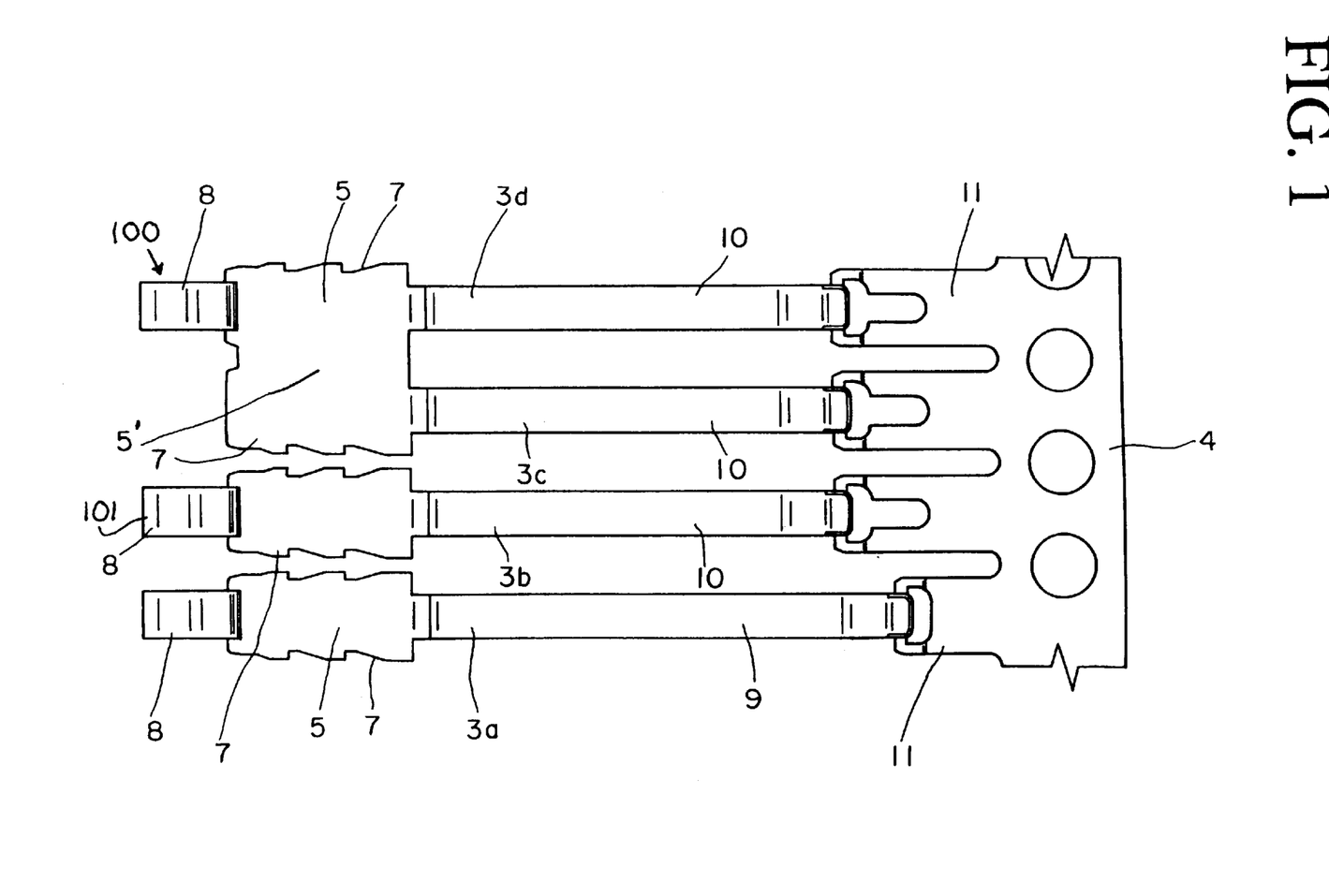
FIG. 1 is a plan view of an arrangement of stamped terminals used in connectors constructed in accordance with the principles of the present invention.

FIG. 1 illustrates an arrangement 100 of connector terminals that are used in constructing connectors of the present invention and particularly in the first connector component 1 thereof. The arrangement 100 includes four terminals 3a–d attached to a carrier strip 4. The terminals 3a–d are stamped and formed from a conductive metal sheet.

Figure 5:
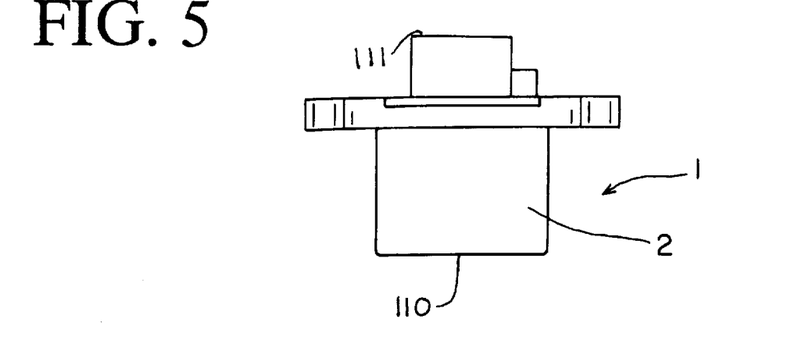
FIG. 5 is a plan view of a first connector component used in connectors of the present invention and in which the terminal arrangements of FIGS. 1 and 3 are used.
Figure 6:
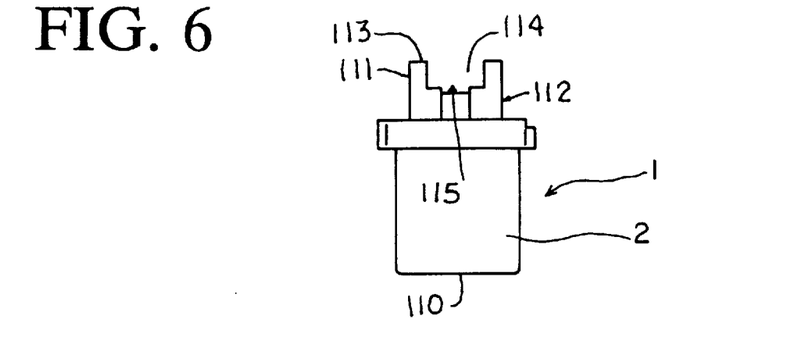
FIG. 6 is a side view of the first connector component of FIG. 5.

The terminals 3a–d are attached to the carrier strip 4 by branch portions 11 that are eventually cut to free the terminals 3a–d to facilitate their insertion into a connector housing 2 (FIG. 5). Three of the terminals 3a, 3b and 3d include first and second engagement portions, respectively indicated in FIG. 1 as 9, 10 and 8. The fourth terminal includes a first engagement portion 10 but does not have second engagement portion as is described in further detail below.

Figure 2:
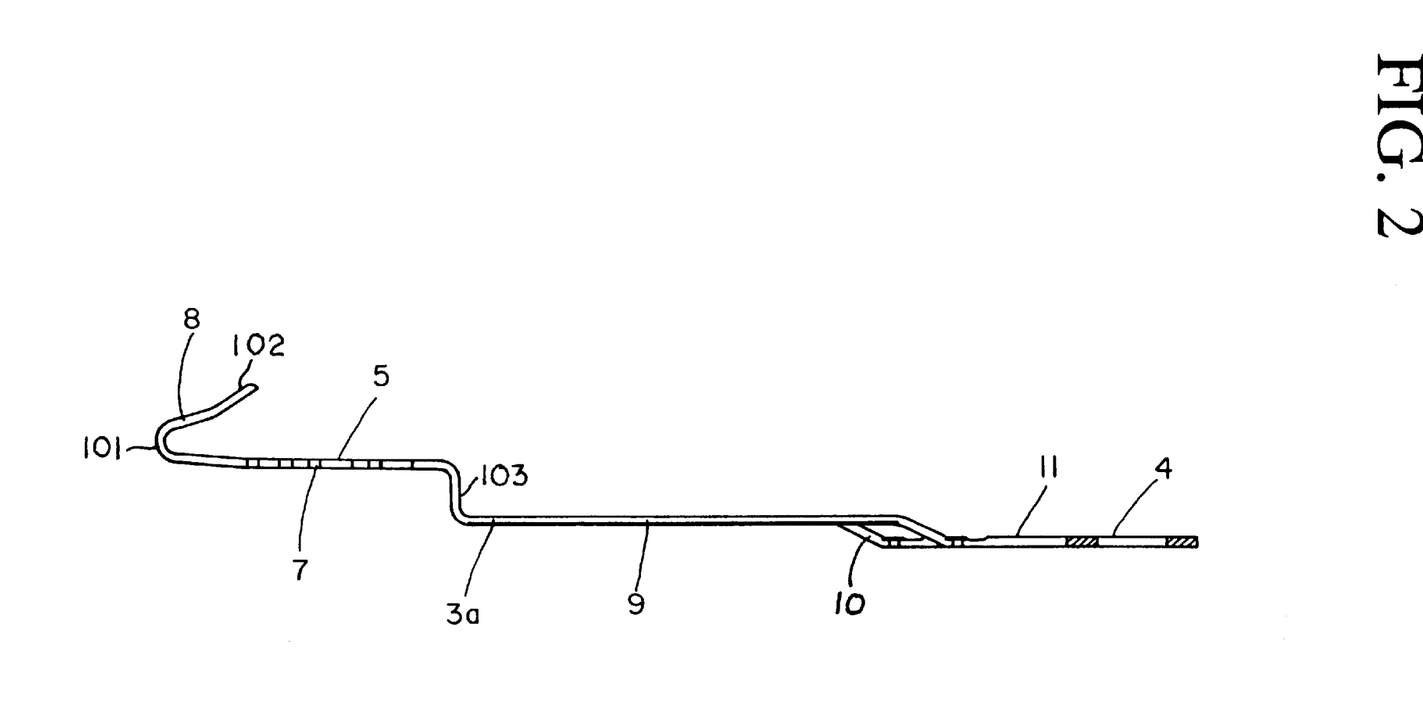
FIG. 2 is a side elevational view of the terminal arrangement of FIG. 1.

As shown best in FIGS. 1 and 2, the first engagement portions 9, 10 of the terminals 3a–d include generally planar, elongated contact blade portions. The first engagement portion 9 of terminal 3a is longer than the first engagement portions 10 of terminal 3b–3d. The second engagement portions 8 of terminals 3a, 3b and 3d include generally U-shaped ends 101 wherein one leg of the U-shape defines a spring contact portion 102 of the terminals.

The first and second contact portions 9, 10 and 8 are separated by associated terminal intermediate, or body portions 5 that lie adjacent a step 103 which serves to separate the first and second contact portions into two different planes. The body portions 5 of the terminals 3a–3d include projections 7 in the form of barbs to engage opposing, interior surfaces of the connector housing 2 in order to secure the terminals in the housing. As show in FIG. 1, the body portions of two of the terminals 3c and 3d are interconnected to form a a common body 5' in order to electrically join or "short" them together. The terminals 3 may be formed from a conductive material such as a phosphor-bronze bronze alloy and the contact blade portions 9, 10 thereof may be plated with gold to increase their conductivity.

Figure 3:
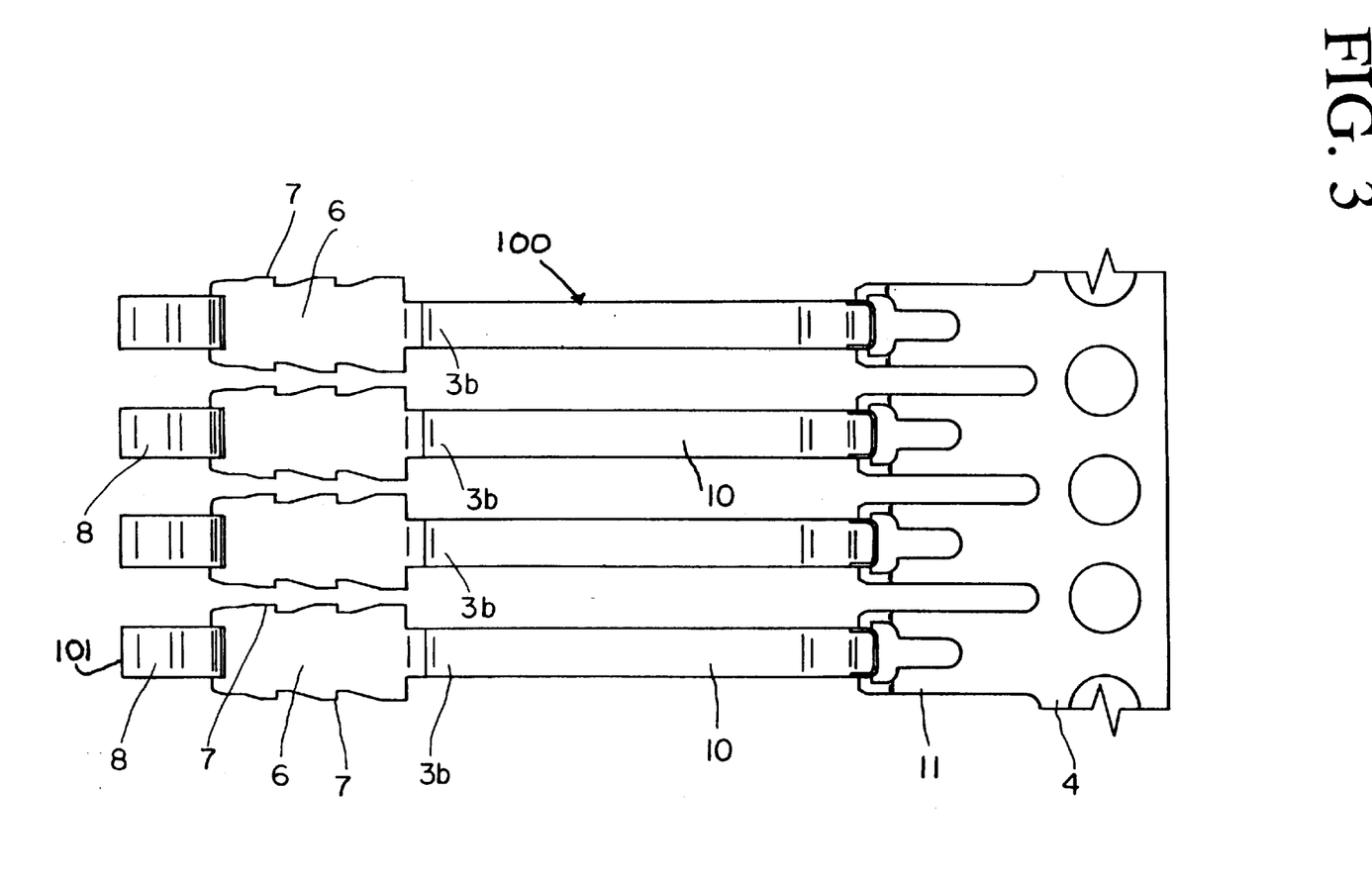
FIG. 3 is a plan view of another arrangement of stamped terminals also used in connectors of the present invention but on an opposite side of the connector.
Figure 4:
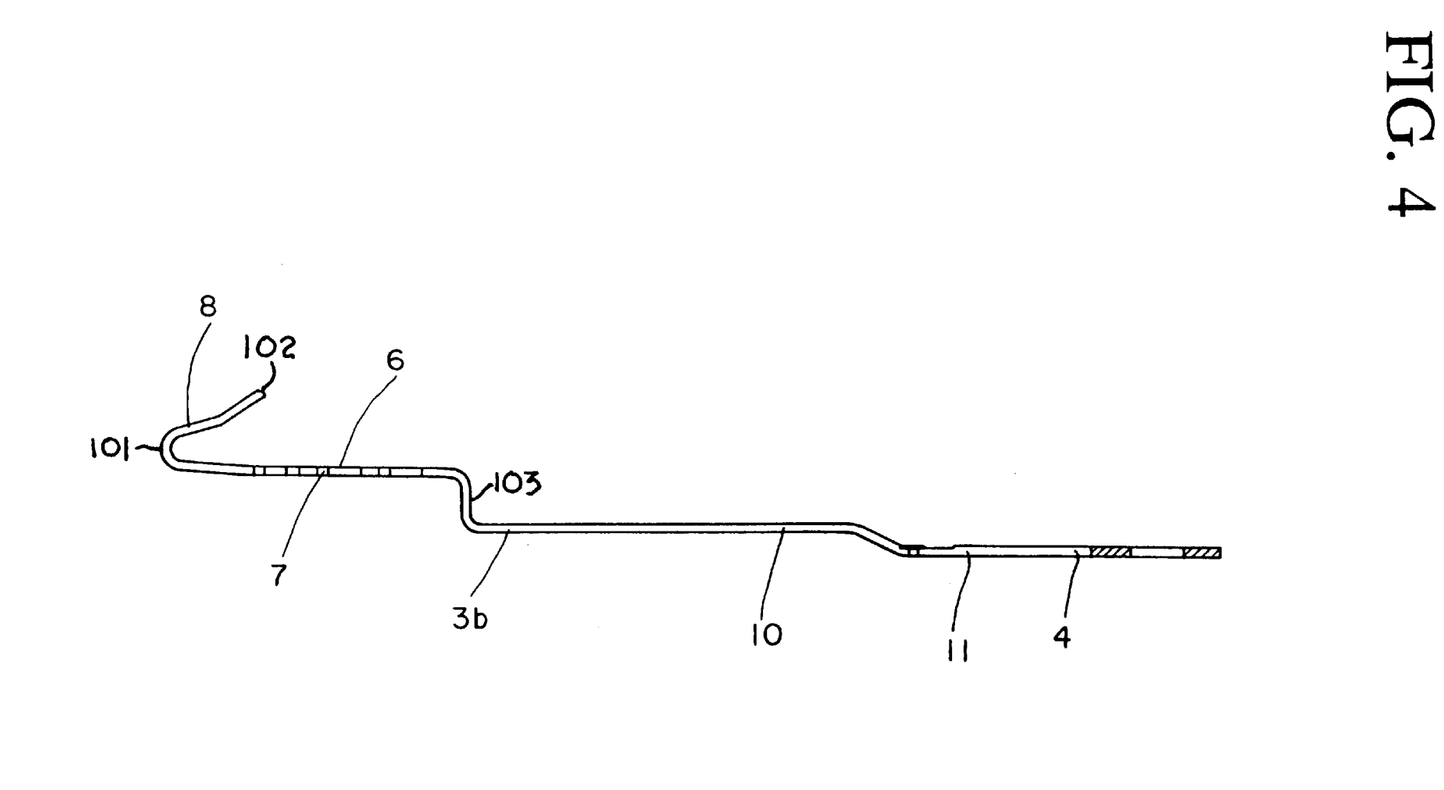
FIG. 4 is a side elevational view of the terminal arrangement of FIG. 3.

A second terminal arrangement is shown in FIGS. 3 and 4 and is similar to that of FIGS. 1 and 2 except that all of the terminals of the second arrangement are identical. In fact, all of the terminals are identical to terminal 3b of the first terminal arrangement and are therefore labeled with the same reference numbers.

The two terminal arrangements of FIGS. 1 and 3 are utilized in a first connector component 1 constructed in accordance with the principles of the present invention. Such a first connector component 1 is illustrated in FIGS. 5–11 and preferably takes the form of a plug or male connector component. The first connector component includes an insulative connector housing 2 having two opposing faces 110, 111. One such face 110 is a mating face in the form of a receptacle 133 that is adapted to mate with an opposing or second connector component 21. The other such face 111 of the first connector component 1 receives and mates with a integrated circuit 106 in the form of an IC chip 41.

Figure 7:
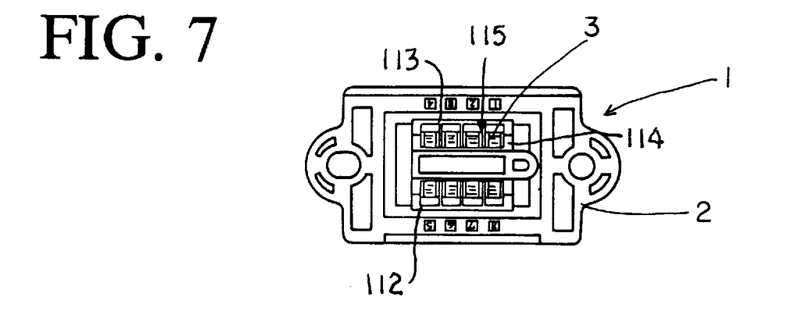
FIG. 7 is a rear view of the first connector component of FIG. 5 and illustrating the IC chip-receiving nest of the first connector component.
Figure 8:
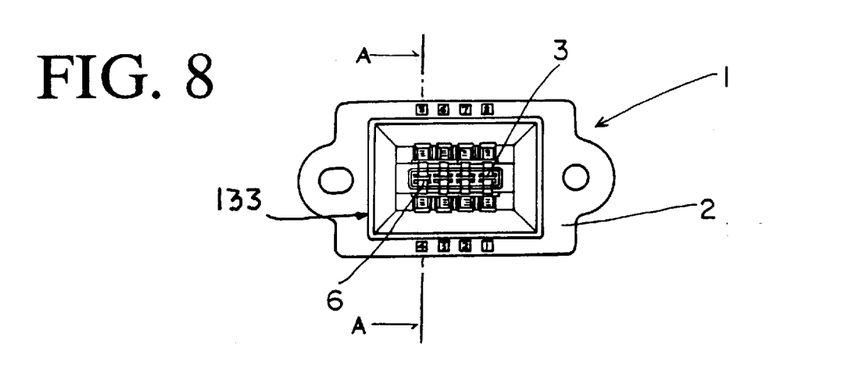
FIG. 8 is a front view of the first connector component.
Figure 9:
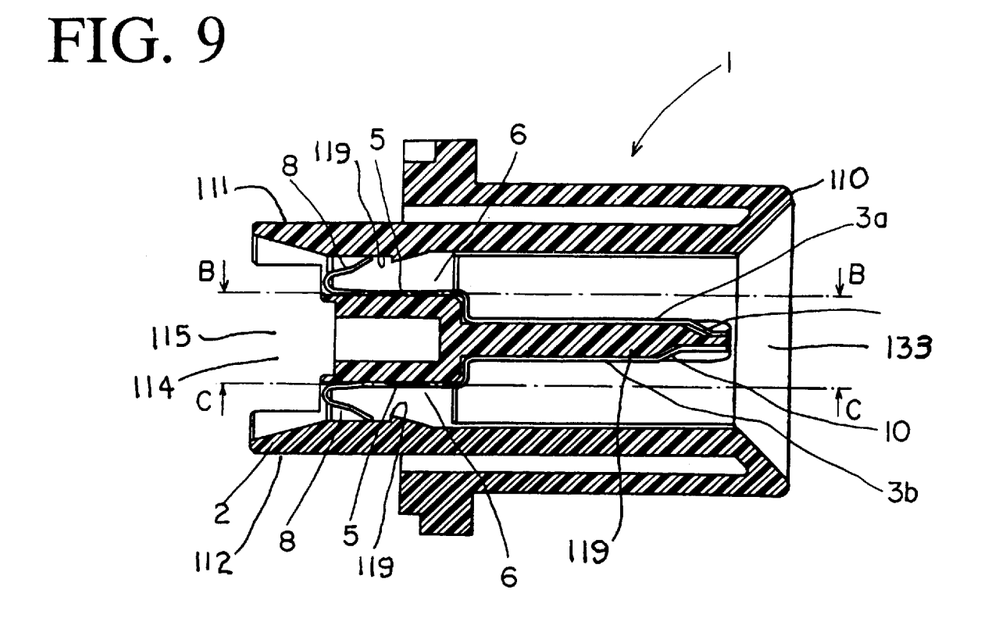
FIG. 9 is an enlarged longitudinal sectional view of the first connector component of FIG. 5 taken generally along the line A—A of FIG. 8 and illustrating the mating face of the first connector component.
Figure 10:
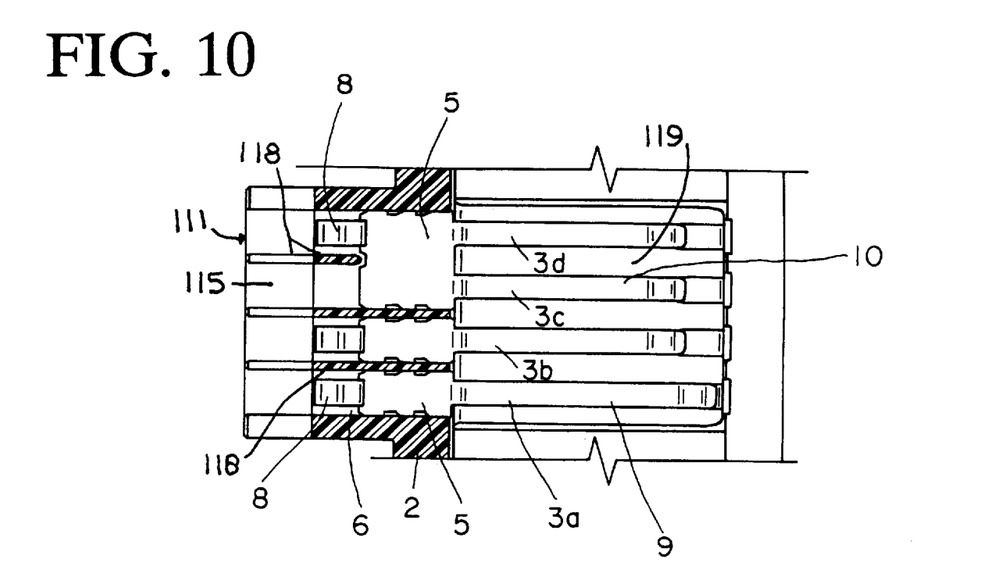
FIG. 10 is an enlarged longitudinal sectional view of the first connector component of FIG. 5 taken generally along line B—B of FIG. 9.
Figure 11:
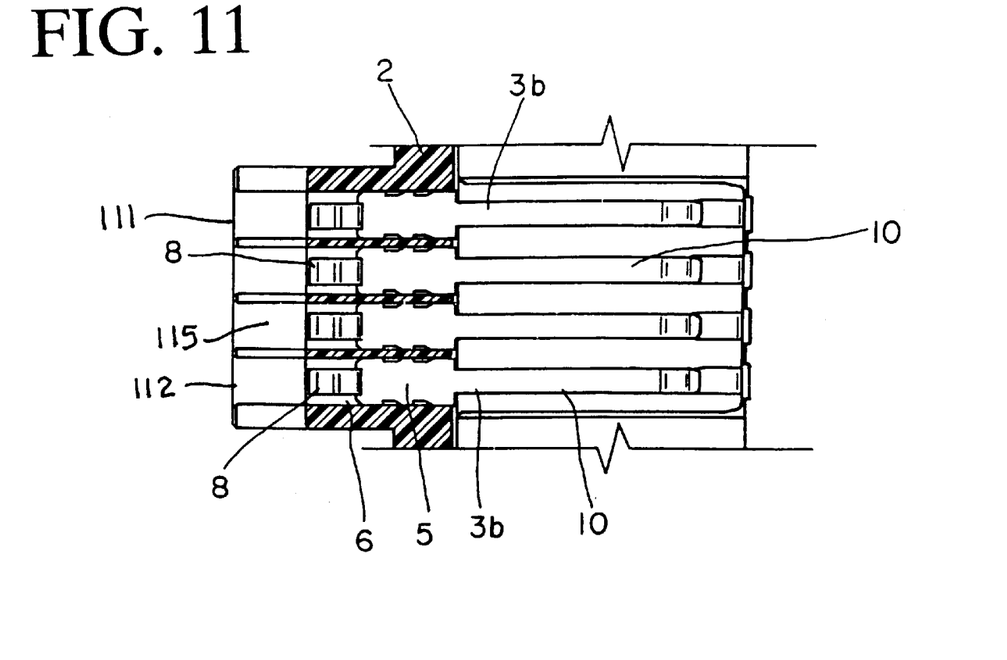
FIG. 11 is an enlarged longitudinal sectional view of the first connector component of FIG. 5 taken generally along line C—C of FIG. 9.
Figure 12:
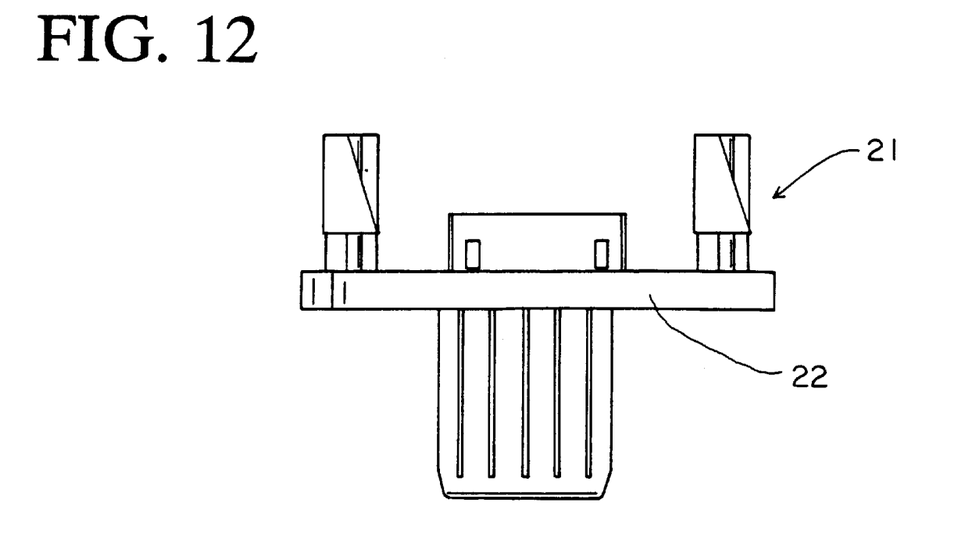
FIG. 12 is a plan view of a second connector component that mates with the first connector component of FIG. 5 to form a connector pair of the present invention.
Figure 13:
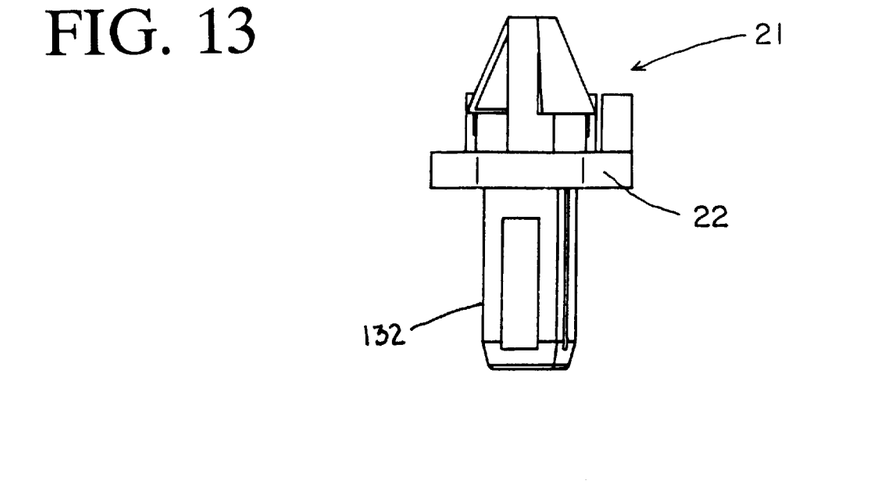
FIG. 13 is a side view of the second connector component of FIG. 12.
Figure 14:
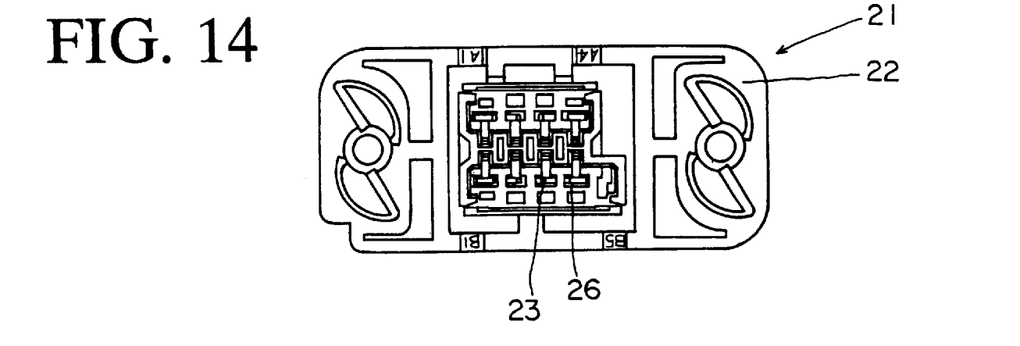
FIG. 14 is a rear elevational view of the second connector component of FIG. 12 and illustrating the circuit engagement face thereof.
Figure 15:
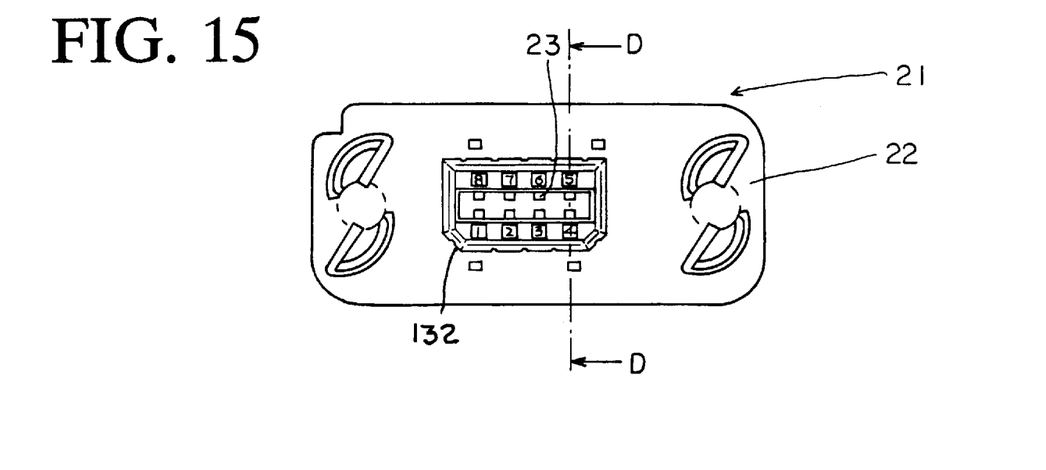
FIG. 15 is a front elevational view of the second connector component of FIG. 12 and illustrating the mating face of the second connector component.
Figure 16:
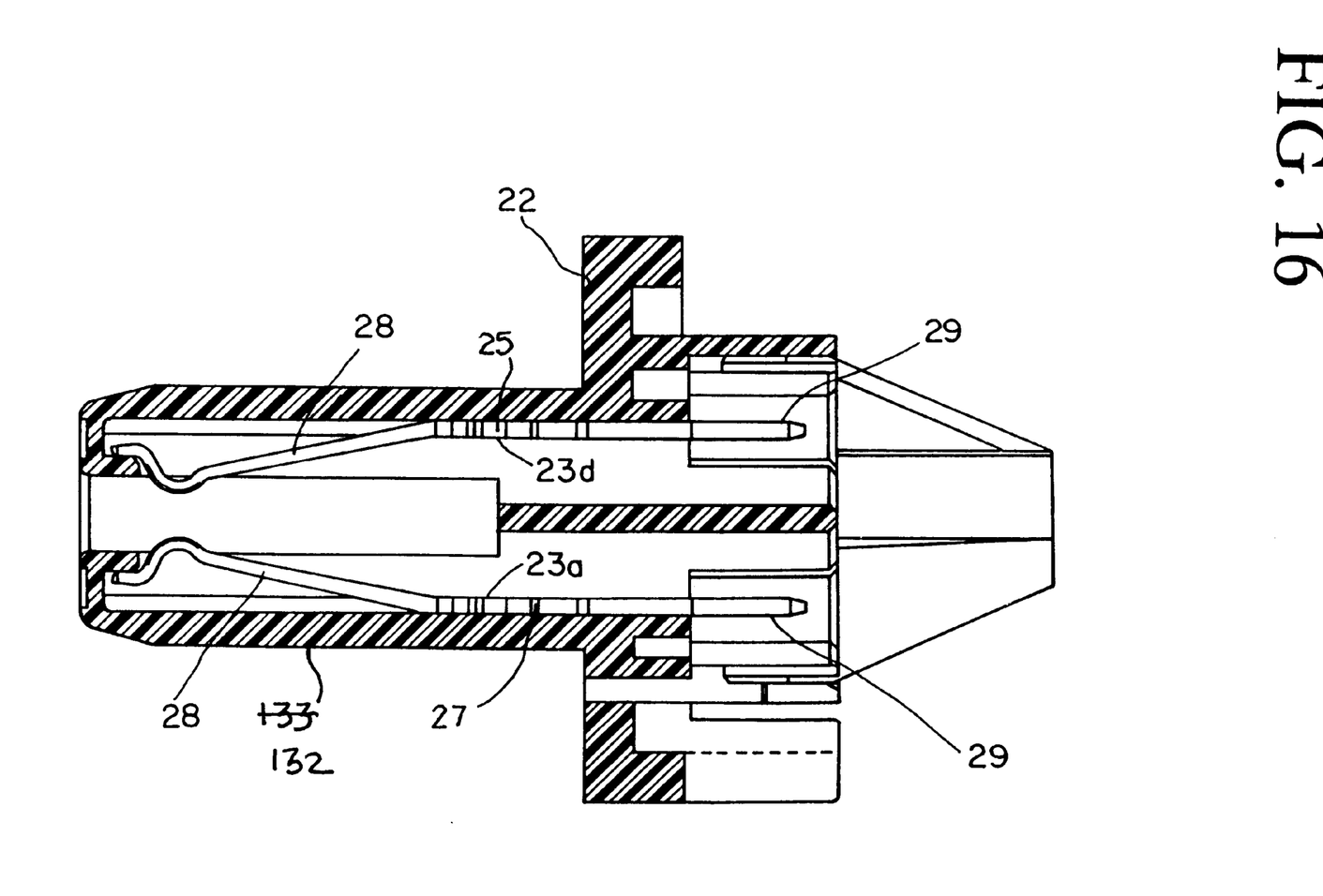
FIG. 16 is an enlarged longitudinal sectional view of the second connector component of FIG. 12 taken along line D—D of FIG. 15.

Turning now to FIG. 7, the chip-receiving face 111 of the connector component includes a mounting block 112 having opposing endwalls 113 separated by an intervening space 114 that cooperate together to define a nest portion 115 thereon that receives the chip 41. The connector housing includes a plurality of openings or terminal receiving cavities 6 (FIG. 9) that extend lengthwise through the connector housing 2 between the two mating faces 110, 111 thereof. These cavities 6 are defined in part by intervening housing walls 118 which are engaged by the terminal housing retention barbs 7. As seen in FIG. 10, one of the housing walls 118 is partially removed in order to accommodate the common body portion 5' of terminals 3c–d.

Figure 19:
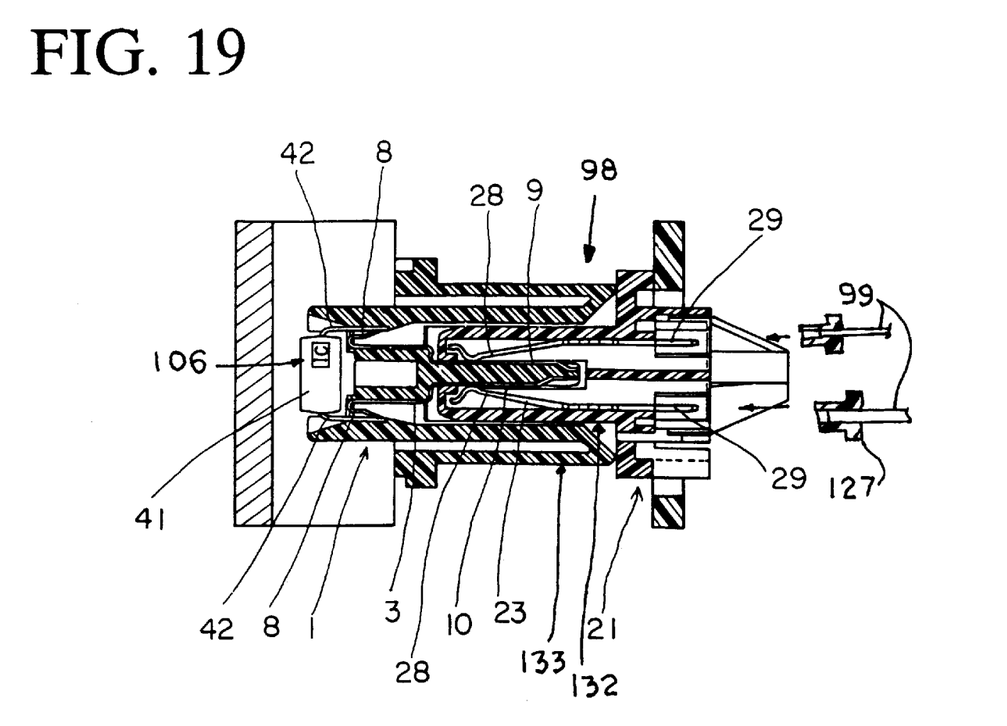
FIG. 19 is a longitudinal sectional view of two connector components of FIGS. 5 and 12 mated together to form a connector pair of the present invention.

The housing cavities 6 are also sized to receive the pins, or leads, 42 of the IC chip 41. These leads 42, as illustrated best in FIG. 19, extend along the top and bottom (as seen in FIG. 19) interior surfaces 119 of the connector component 1 such that when the IC chip 41 is inserted into the chip-receiving nest portion 115, the chip leads 42 thereof will impinge against the second contact portions 8 of the terminals, and specifically against the contact spring portions 101 thereof.

The first contact portions 9, 10 of the terminals (as well as the body portions 5,5' thereof) are supported on an interior connector terminal bed, or projection, 119 that extends lengthwise through the connector housing 2 between the top and bottom sets of terminal retention cavities 6 thereof. The terminal contact blades 9, 10 are supported by the terminal projection 119, the ends of which are contoured to receive the forward engagement ends of the contact blades 9, 10 such as in the form of a series of slots (not shown). As shown in FIGS. 9 and 19, the terminal projection 119 may be considered as a mating or engagement face that mates with the second connector component 21.

In assembling the connector component 1, the terminal arrangement 3 of terminals 3a, 3b, 3c and 3d as shown in FIGS. 1 and 2 are cut to form a four-terminal segment 100 as shown in FIG. 1 to remove the segment from carrier strip 4, while leaving the terminals 3 integrally connected together by the remaining segment part of the carrier strip 4. The four terminals 3 are then inserted into the connector housing 2 as a whole segment. Likewise, the terminal-arrangement of identical terminals 3b, (FIG. 3) is also inserted as a segment into connector housing 2. After insertion into the connector housing 2, the terminals 3 are then separated from their segment carrier strips 4 by cutting them at their respective branches 11.

Referring now to FIGS. 12–15, a second, or male connector component is illustrated generally at 21. This second connector component 21 has a plurality of terminals 23 arranged at predetermined intervals in two rows and mounted in its insulative connector housing 22. The terminals of this second connector component are indicated generally at 23, and individual terminals are indicated at 23a–d. The plug portion 132 of the second connector component 21 is received within the receptacle portion 133 of the first connector component 1.

Figure 17:
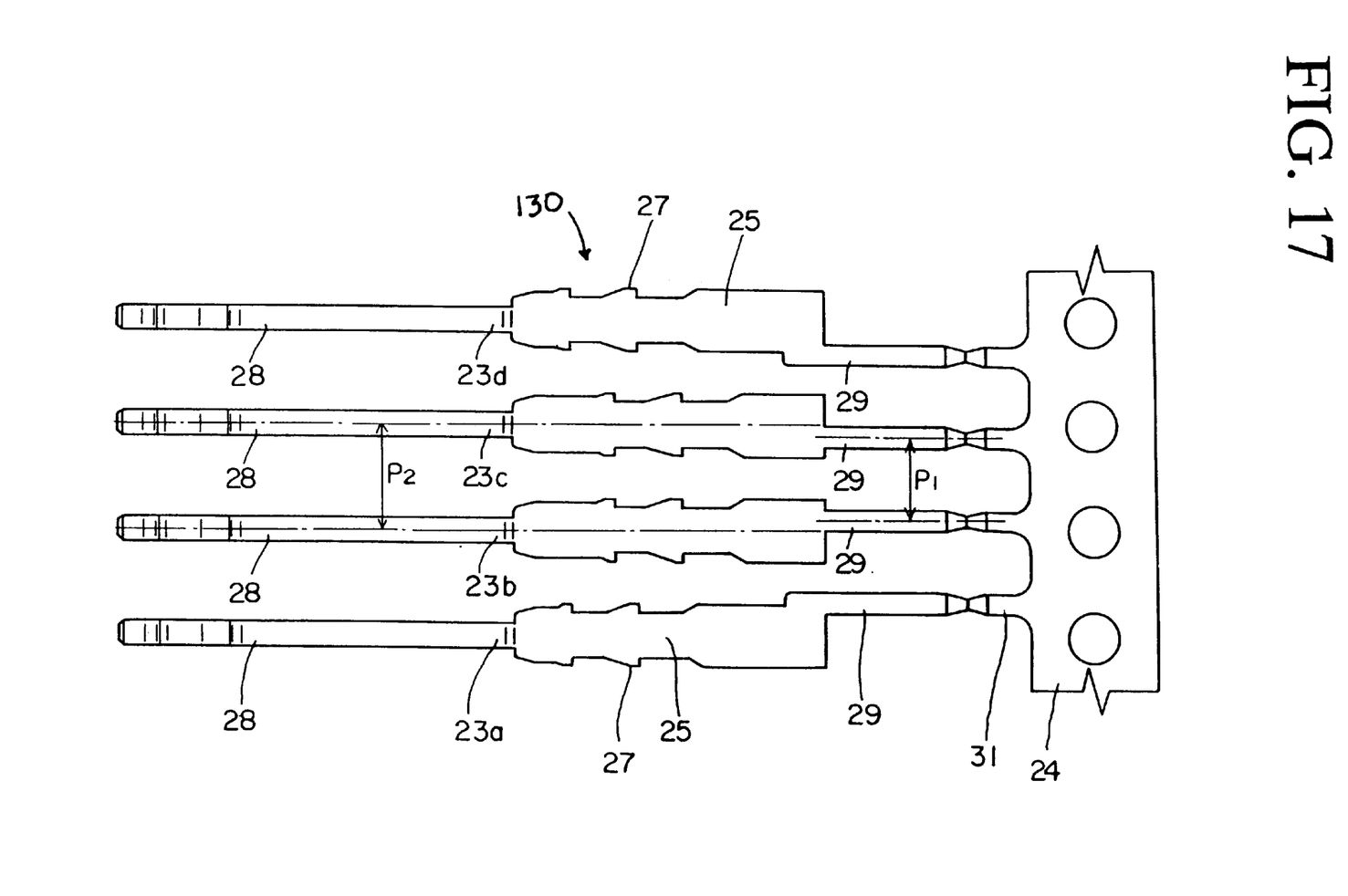
FIG. 17 is a plan view of a terminal arrangement utilized in the second connector component of FIG. 12.
Figure 18:
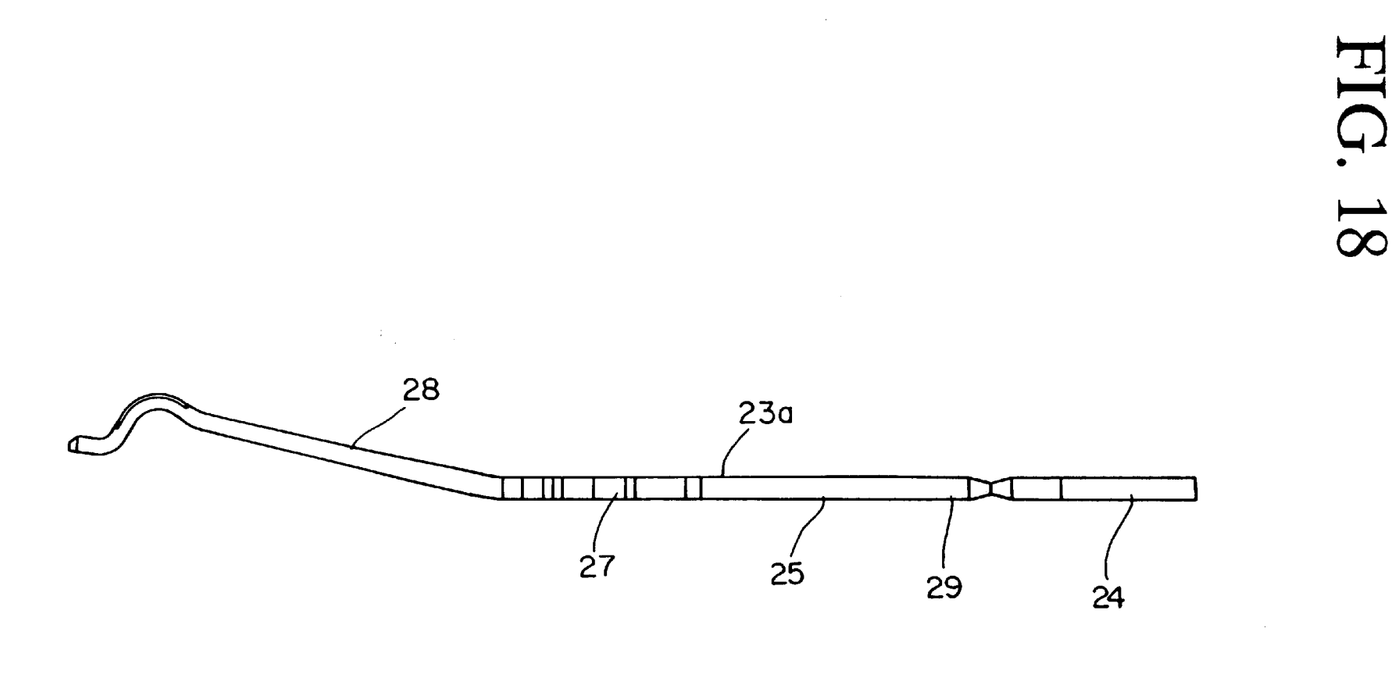
FIG. 18 is a side elevational view of the terminal arrangement FIG. 17.

As is the case with the first connector component described above, a parallel arrangement of terminals 23a–d is stamped out of a piece of thin metal sheet as a segment 130. Each terminal 23, is illustrated in FIGS. 17 & 18, includes a forward resilient contact blade 28 for engaging a selected terminal of the first connector component, a relatively wide, intermediate or body section 25 having barbs 7 on its opposing sides that engage the inner walls of a terminal cavities 26 in the connector housing 22. Lastly, each terminal 23 includes a flat contact section 29 for engaging a selected terminal of an opposing circuit wire connector 127. The terminals are integrally connected to a carrier strip 24 by way of associated branches 31. All of the flat or rear, contact sections 29 extend rearward from the body sections 25 in a manner such that their center lines are offset from the center lines of the contact blade portions 28.

This results in different pitches $P_1$, $P_2$ occurring between the two contact sections 28, 29 of the terminals 23 of the second connector component 21. Thus, when the two connector components 1, 21 are mated together as in FIG. 19, regardless of the pitch of the leads 42 of the IC chip 41, a standard pitch may be used for the circuit wires 99.

In the assembly of the second connector component 21, parallel-arrangement of terminals 23a–d is cut to remove it as a segment 130 from the major part of the carrier strip 24, while leaving all four terminals 23 shown integrally connected together to the remaining part of the carrier strip 24. These four terminals 23 are then inserted in the connector housing 22 as a whole. After insertion, all of the terminals 23 are separated from the carrier strips 24 by cutting the branches 31. Two arrangements of the terminals 23a–d are mounted in the connector housing 22 with their forward contact blade sections 28 aligned to and opposing each other in the connector housing 22 as illustrated in FIG. 19.

As show in FIG. 19, the first and second connector components 1 and 21 are mated together. The terminals 3 of the first connector component 1 are arranged at the same pitch as the second connector component, terminal contact portions 28, thereby allowing the contact blades 9 and 10 of the first connector component terminals 3 to engage and mate with the contact blade sections 28 of the second connector component terminals 23. The leads 42 of an integrated circuit chip 41 are then inserted into the first connector component cavity 6 so that they engage the existing contact springs 102 of the terminal rear contact portions 8. One such lead will not engage the voided contact spring of terminal 3C (FIG. 1) This lead will typically be a "dummy" lead that is present on an IC chip only for purposes of facilitating its insertion into a socket or onto a circuit board. It may not be connected to the circuitry of the IC chip or it may be a lead that is unnecessary to the wires 99.

The terminals 3 of the first connector component 1 are arranged such that they have the same pitch as the leads 42 of the IC chip 41. As mentioned above, two of the terminals 3c, 3d are interconnected together to permit either two inputs to be directed to a single input lead of the chip 41 or a single output of the chip 41 to be directed to two different circuits by way of the wires 99 that are connected to the connector 98. The offset pitch $P_2$ of the second connector component 21 permits the connector 98 to be used with circuit wire arrangements 99 having pitches different than that of the chip leads 41.

In coupling the connector components 1, 21 together, the plug portion 132 of the second connector component 21 is insulated into the receptacle portion 133 of the first connector component. The contact blade portion 9 of the one terminal 3a of the first connector component meets and contacts one of the forward or contact blade portions 28 of the second connector component terminals 23. Further advancement of the first connector component 1 permits the other, shorter contact blade portions 10 to engage the forward contact blade portions 28 of the terminals 23 of the second connector component 21. This terminal 3a is connected to a selected grounding lead terminal of the integrated circuit 41, and it makes the first contact when the two connector components 1, 21 are mated together to thereby establish a ground connection therefor before the other circuits are mated to the integrated circuit chip 41.

In another important aspect of the present invention, the terminals shown in FIGS. 1, 3 and 17 are stamped in arrangement, or arrays, of four or whatever number of terminals are supported on one surface of the connector projection. This eliminates the necessity of preparing different dies allocated to different terminal shapes. The costs associated with manufacturing such terminals therefore decreases. The terminals 3a–3d, 3 and 23 shown respectively in FIGS. 1, 3 and 17 are produced in as integrated form using a "four-Up" die in which the stamping stations in the die are arranged in order to effect each step in stamping out the terminals. When stamped as a set of terminals, the set may be inserted into its associated connector housing as a set, eliminating the need for single insertions.

Although the present invention has been described in terms of male and female connector components, it will be appreciated that the present invention will bring substantially the same benefits to other style connector components as well. Accordingly, it will be appreciated that the embodiments of the present invention have discussed herein are merely illustrative of a few applications of the principles of the invention. Numerous modifications may be made by those skilled in the art without departing from the true spirit and scope of the invention.

We claim:

1. An electrical connector for effecting an electrical connection between an integrated circuit and a second, mating electrical connector, comprising:

a connector housing having a nest portion for receiving said integrated circuit therein and an engagement portion for engaging said second, mating electrical connector, said connector housing including at least one passage extending therethrough;

a plurality of conductive terminals disposed in said passage and extending between said nest portion and said engagement portion, said terminals having distinct first and second contact portions and a body portion for retaining said terminals within said housing and located between said first and second contact portions, each said first contact portion including a contact spring that springingly engages a lead of said integrated circuit upon insertion of said integrated circuit into said nest portion and each said second contact portion including a contact blade for engaging a mating terminal of said second mating electrical connector upon mating said first and second electrical connectors, one of said terminals having only a single contact spring, a pair of spaced apart, generally parallel contact blades and a body portion substantially wider than the body portions of others of said terminals whereby an electrical circuit may be established between a single one of said leads of the integrated circuit and a pair of the mating terminals of the second electrical connector.

2. The electrical connector of claim 1, wherein said engagement portion includes a receptacle portion for receiving a plug portion of said second electrical connector.

3. The electrical connector of claim 2, wherein said contact blades extend into said receptacle portion such that upon insertion of said plug portion into said receptacle portion, terminal contact springs of said plug portion springingly engage said contact blades within said receptacle.

4. The electrical connector of claim 1, wherein said nest portion includes a pair of spaced-apart walls separated by an intervening space dimensioned to received said integrated circuit.

5. The electrical connector of claim 1, wherein one of said contact blades is longer than others of said contact blades.

* * * * *